(12) United States Patent
Downing

(10) Patent No.: US 11,762,212 B2
(45) Date of Patent: Sep. 19, 2023

(54) DIFFUSE ILLUMINATION SYSTEM HAVING VCSEL EMITTERS AND ARRAY OF NANOSTRUCTURES

(71) Applicant: STMICROELECTRONICS (RESEARCH & DEVELOPMENT) LIMITED, Marlow (GB)

(72) Inventor: James Peter Drummond Downing, Doune (GB)

(73) Assignee: STMICROELECTRONICS (RESEARCH & DEVELOPMENT) LIMITED, Marlow (GB)

( * ) Notice: Subject to any disclaimer, the term of this patent is extended or adjusted under 35 U.S.C. 154(b) by 689 days.

(21) Appl. No.: 16/817,435

(22) Filed: Mar. 12, 2020

(65) Prior Publication Data

US 2021/0286191 A1 Sep. 16, 2021

(51) Int. Cl.
*G01S 7/481* (2006.01)
*G01S 17/894* (2020.01)
*G02B 5/02* (2006.01)
*G02B 27/48* (2006.01)
*H01S 5/42* (2006.01)

(52) U.S. Cl.
CPC ............ *G02B 27/48* (2013.01); *G01S 7/4815* (2013.01); *G01S 17/894* (2020.01); *G02B 5/0221* (2013.01); *G02B 5/0278* (2013.01); *G02B 2207/101* (2013.01); *H01S 5/423* (2013.01)

(58) Field of Classification Search
CPC .... G01S 7/4815; G01S 7/4865; G01S 17/894; G02B 1/002; G02B 5/0221; G02B 5/0278; G02B 5/3083; G02B 26/06; G02B 27/48; G02B 2207/101; H01S 5/423
See application file for complete search history.

(56) References Cited

U.S. PATENT DOCUMENTS

| 8,743,923 | B2 | 6/2014 | Geske et al. |
| 9,693,839 | B2 | 7/2017 | Atiya et al. |
| 2018/0129866 | A1 | 5/2018 | Hicks et al. |
| 2018/0301875 | A1* | 10/2018 | Burroughs ............... H01S 5/183 |
| 2019/0041660 | A1 | 2/2019 | Ahmed |
| 2019/0064532 | A1* | 2/2019 | Riley, Jr. ............. G02B 27/0916 |

OTHER PUBLICATIONS

Trisnadi, "Speckle contrast reduction in laser projection displays," Proc. SPIE,Projection Displays VIII vol. 4657, San Jose, Californian, Apr. 26, 2002, pp. 131-137.

* cited by examiner

*Primary Examiner* — Ryan S Dunning
(74) *Attorney, Agent, or Firm* — SEED IP LAW GROUP LLP

(57) ABSTRACT

A diffuse illumination system for reducing diffusion-related illumination inhomogeneities includes an array of vertical cavity surface emitting laser (VCSEL) emitters and a diffusing element including a transparent substrate and an array of nanostructures. A dimension and a shape of each nanostructure is configured to retard phases of two orthogonal polarization states of light incident on each nanostructure from the emitters for reducing illumination inhomogeneities in the output.

23 Claims, 4 Drawing Sheets

DIFFUSE ILLUMINATION SYSTEM HAVING VCSEL EMITTERS AND ARRAY OF NANOSTRUCTURES

BACKGROUND

Technical Field

The present application is directed generally to illumination systems, and more specifically, to diffuse illumination systems.

Description of the Related Art

Illumination systems, and particularly laser-based illumination systems that use a diffusing element, are impacted by speckle in the illumination output. Speckle, as observed in the output, results from interference of coherent illumination propagating through non-identical paths of the diffusing element. Moreover, efficient laser sources in mobile applications are typically configured as multi-emitter laser arrays, such as vertical cavity surface emitting laser (VCSEL) arrays, which produce light beams of high spectral purity, low divergence and high coherence, thereby enhancing the intensity of speckle patterns. In addition, beating may occur between the speckle patterns associated with independent VCSEL emitters, thereby creating structured non-uniformity in the output illumination.

Typically, structured non-uniformity has a high frequency, as observed on an illuminated target or as imaged by a detector. Beating pattern frequencies are typically higher than frequencies associated with speckle. For time-of-flight applications having less than mega-pixel resolutions, the beating of speckle interference patterns in creating high frequency structured non-uniform illuminated output is not necessarily a problem, since the resolution of these sensor arrays may be too small to detect the structured inhomogeneities. However, since advances in technology are leading to increased sensor resolutions, e.g., mega-pixel densities and greater, there is a desire to mitigate the generation of inhomogeneities in illumination output.

BRIEF SUMMARY

Embodiments of the present disclosure are directed to mitigating output illumination inhomogeneities associated with diffuse illumination systems. Embodiments of the present disclosure may be used in conjunction with systems and methods for time-of-flight analyses and machine vision.

The present disclosure provides a polarization dependent diffusing element that applies non-uniform phase retardation across the diffusing element to a wave-front of light incident on the diffusing element by employing a plurality of patterned nanostructures that retard first and second orthogonal polarization states of the incident light. This has the effect of reducing the correlation of noise in a VCSEL system, thereby reducing the intensity of high frequency structured illumination patterns caused by the beating of speckle patterns.

In one embodiment, a diffuse illumination system for reducing diffusion-related illumination inhomogeneities is provided, including an array of vertical cavity surface emitting laser (VCSEL) emitters. Each emitter has an emission surface though which light is emitted. The system further includes a diffusing element including a transparent substrate and an array of nanostructures. The transparent substrate has an upper surface and a lower surface. The lower surface of the transparent substrate is positioned on the emission surface of each of the plurality of emitters and the array of nanostructures is positioned on the upper surface of the transparent substrate. A dimension and a shape of each nanostructure is configured to retard a phase of a first polarization state and retard a phase of a second polarization state of light incident on each nanostructure for reducing illumination inhomogeneities. The first polarization state is orthogonal to the second polarization state and the light incident on each nanostructure is emitted by at least one emitter.

In another embodiment, a system is provided, including the diffuse illumination system, and further including a processor, a lens system, and a detector. The processor is configured to trigger light to be emitted by the VCSEL emitters, and the light is directed via the lens system to a target. The detector is configured to receive light reflected from the target via the lens system.

In another embodiment, the system is a time-of-flight camera. The processor is configured to determine time-of-flight to the target based upon the emitted and the received light.

In another embodiment, the system is a machine vision camera.

BRIEF DESCRIPTION OF THE SEVERAL VIEWS OF THE DRAWINGS

For a better understanding of the present disclosure, embodiments thereof are now described purely by way of non-limiting example, with reference to the attached drawings, wherein.

DETAILED DESCRIPTION

In the following description, certain specific details are set forth in order to provide a thorough understanding of various aspects of the disclosed subject matter.

However, the disclosed subject matter may be practiced without these specific details. In some instances, well-known structures and methods of manufacturing electronic devices, optical lenses, and sensors have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

It is noted that the dimensions set forth herein are provided as examples. Other dimensions are envisioned for this embodiment and all other embodiments of this application.

Figure 1:
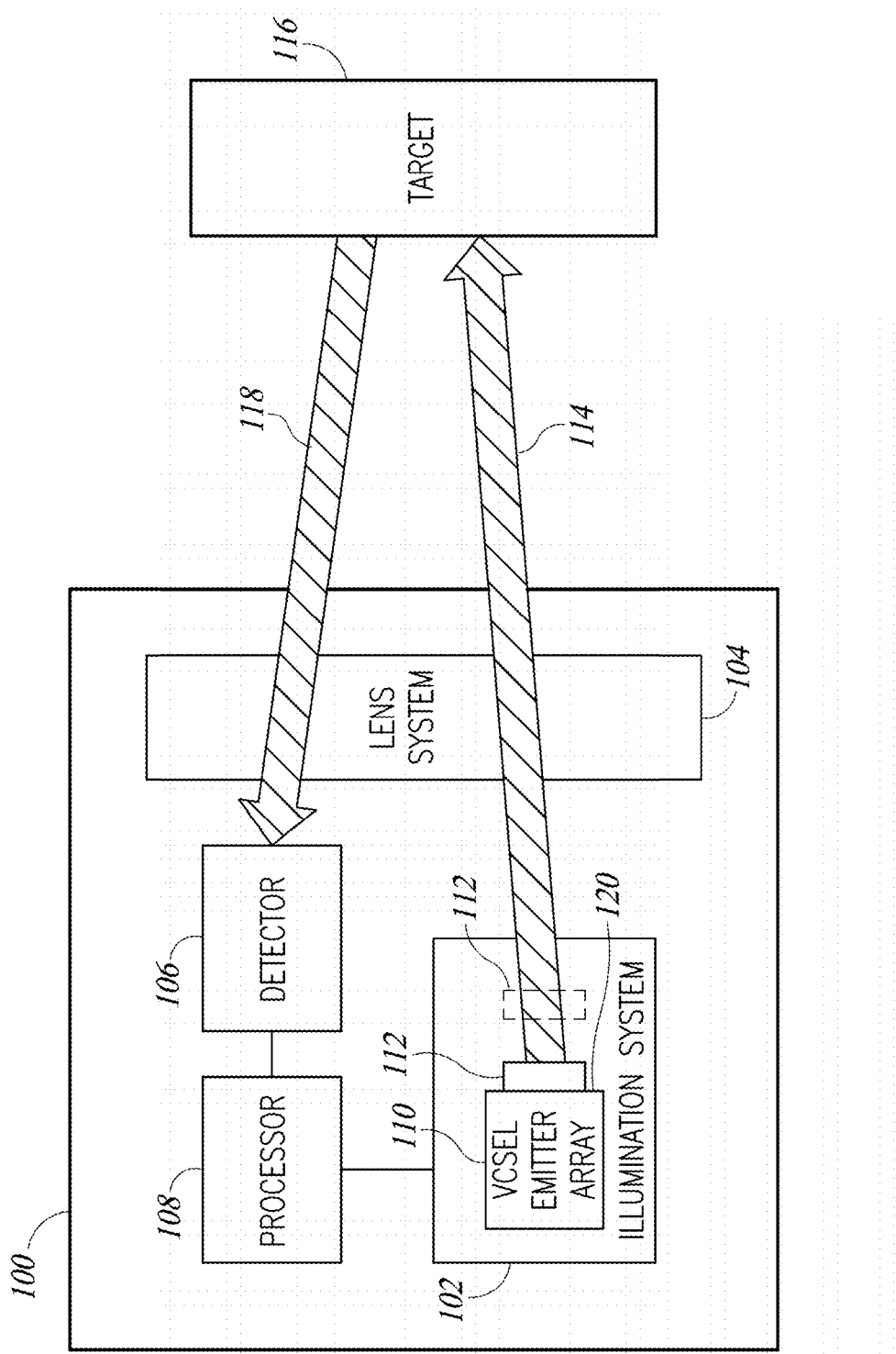
FIG. 1 is a schematic diagram of a system for imaging a target, according to an embodiment of the present disclosure.

FIG. 1 is a schematic diagram of a system 100 for imaging a target, according to an embodiment of the present disclosure. In one embodiment, the system 100 is a time-of-flight camera.

Conventional time-of-flight systems are known to those of skill in the art and will not be discussed in full detail. A conventional range imaging system provides a time-of-flight camera that employs time-of-flight techniques to resolve distances between the camera and the subject (i.e., one or more points on an illuminated target), by measuring the round trip time of a light signal provided by a laser or an light emitting diode (LED). Systems may include radio frequency (RF) modulated systems that modulate the transmitted beam with an RF carrier, then measure the phase shift of the received carrier beam, and direct time-of-flight systems that measure the direct time-of-flight for a single laser pulse to leave the camera and reflect back onto a focal plane sensor array.

In another embodiment, the system 100 is a machine vision camera. Conventional machine vision camera systems are known to those of skill in the art and will not be discussed in full detail. Primary uses for machine vision are imaging-based automatic inspection, sorting and robot guidance. Machine vision refers to the ability of a computer to acquire and extract information from an image on an automated basis. The imaging device (i.e., machine vision camera) may be separate from a main image processing unit or combined with it. Inclusion of the full processing function into the same enclosure as the camera is often referred to as embedded processing.

As illustrated, the system 100 includes a diffuse illumination system 102, a lens system 104, a detector 106, and a processor 108. The illumination system 102 includes a vertical cavity surface emitting laser (VCSEL) emitter array 110 and a diffusing element 112. In one embodiment, the processor 108 is configured to trigger light 114 to be generated and/or emitted by emitters of the VCSEL emitter array 110. The lens system 104 focuses, and may also assist an operator in directing, the emitted light 114 to a target 116. The system 100 is configured such that reflected light 118 (i.e., the emitted light 114 reflected by the target 116), upon passing back through the lens system 104, is focused onto the detector 106. For a time-of-flight system 100, the processor 108 is configured to determine distance to the target 116 based upon the time-of-flight of the emitted and the received light 114,118. For a machine vision system 100, the processor 108 may be configured to further process the image captured by the detector 106 based upon the specifications of the particular machine vision system 100. Although not shown, the system 100 may include one or more of analog-to-digital converters (ADC), digital-to-analog converters (DAC), signal processing software/hardware, memory, I/O interfaces, power sources and bus lines. The various components of such systems are well known in the art and will not be discussed here in further detail.

The lens system 104 may include one or more optical components (e.g., lenses, splitters, filters). In one embodiment, the emitted light 114 and the reflected light 118 pass through identical components of the lens system 104, however the scope of the present disclosure covers the lens system 104 being two lens systems, a first lens system for focusing and/or directing the emitted light 114, and a second lens system for focusing and/or directing the reflected light 118. The first and second lens systems may share one or more components or may share none of their respective components. As illustrated, the diffusing element 112 of the illumination system 102 may be in direct contact with a first surface 120 (also referred to as an upper surface) of the VCSEL emitter array 110. However, in an alternative embodiment, an air gap (not shown) or a transparent spacing element (not shown) may be positioned between the upper surface 120 of the VCSEL emitter array 110 and the diffusing element 112. The air-gap between the VCSEL emitter array 110 and the first surface 120 of the diffusing element 112 may be achieved by having appropriate mounting features on a mechanical housing (cap) onto which we may attach the diffusing element 112 and mount the combination of the diffusing element 112 and cap onto a substrate upon which the VCSEL emitter array 110 is seated. In an embodiment of the present disclosure, the VCSEL emitter array 110 is configured as a two-dimensional (2D) VCSEL emitter array.

Figure 2:
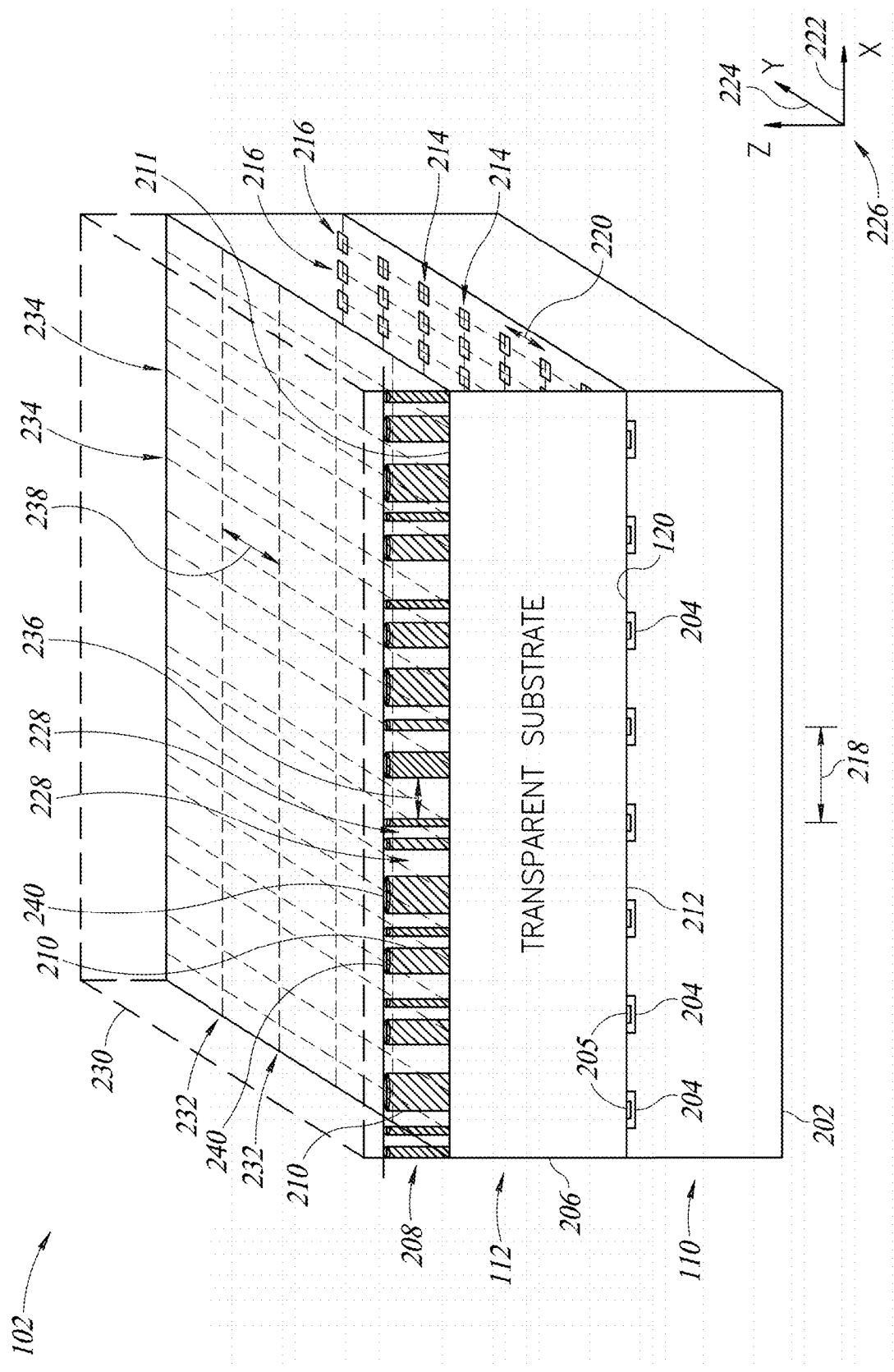
FIG. 2 is a schematic diagram of the diffuse illumination component of the system of FIG. 1, according to an embodiment of the present disclosure.

FIG. 2 is a schematic diagram of the diffuse illumination system 102 of FIG. 1, according to an embodiment of the present disclosure. As will be described in more detail below, embodiments of the diffuse illumination system 102 reduce diffusion-related illumination inhomogeneities present in conventional illumination systems having diffusing elements (also referred to as light diffusers or simply diffusers).

Illumination systems that include laser light sources, which emit light of very narrow bandwidths and typically small angles of dispersion, often employ diffusers to help increase the angle of dispersion so that far-field target edges are adequately illuminated. However, one drawback to using a diffuser is the introduction of speckle patterns in the illumination output, as observed on an illuminated target and/or as imaged by system detectors. Furthermore, depending upon the layout and/or dimensions of the laser light sources in conjunction with the layout of the diffuser (e.g., diffusers are often built from a plurality of segments (i.e., sub-diffusers or apertures), and thus have a particular optical period), an optical beating may occur between the speckle patterns created by each of the independent laser light sources, thereby generating a structured low frequency noise pattern (i.e., a beat pattern), as observed on the illuminated target and/or as imaged by system detectors.

Figure 3:
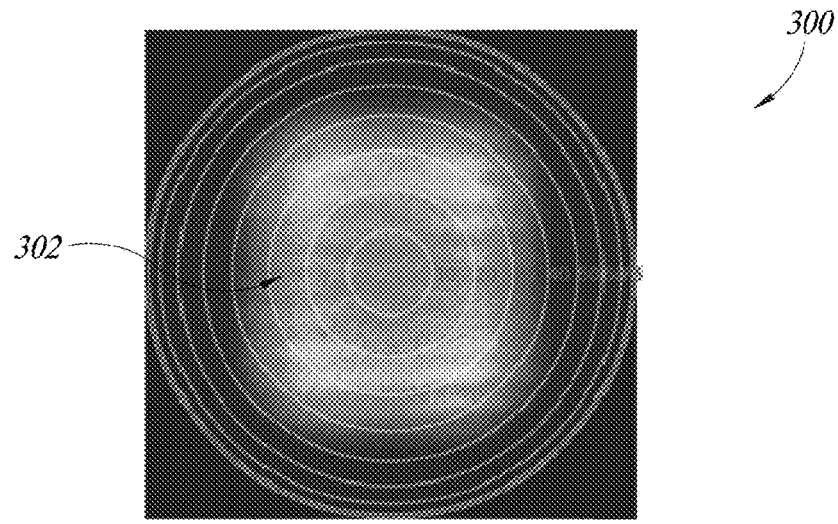
FIG. 3 illustrates a speckle pattern in an output of a conventional illumination system.

For example, FIG. 3 illustrates a speckle pattern 302 in an output 300 of a conventional illumination system. The speckle pattern 302 is caused by laser light (emitted by laser emitters positioned in a 2D array) passing through a diffusing element. The inhomogeneities in the output, as illustrated by the non-structured variations 302 in the intensity of the output 300, can be clearly seen. Speckle occurs when some of the coherent light rays from a single laser emitter pass through a portion of a diffuser, but because of irregularities in the manufacture of the diffuser, such as non-planar surfaces, a variable width, non-homogeneous distribution of material composing the diffuser and/or the material composing the diffuser having impurities introduced during manufacture, to list only a few, take different paths through the diffuser and then interfere with one another in constructive and destructive manners to generate speckle patterns. The effect of this interference between coherent light results in a non-structured pattern of illumination (i.e., a speckle pattern) in addition to a low-frequency beat pattern due to the non-optimized optic/emitter array configuration off the conventional illumination system.

Figure 4:
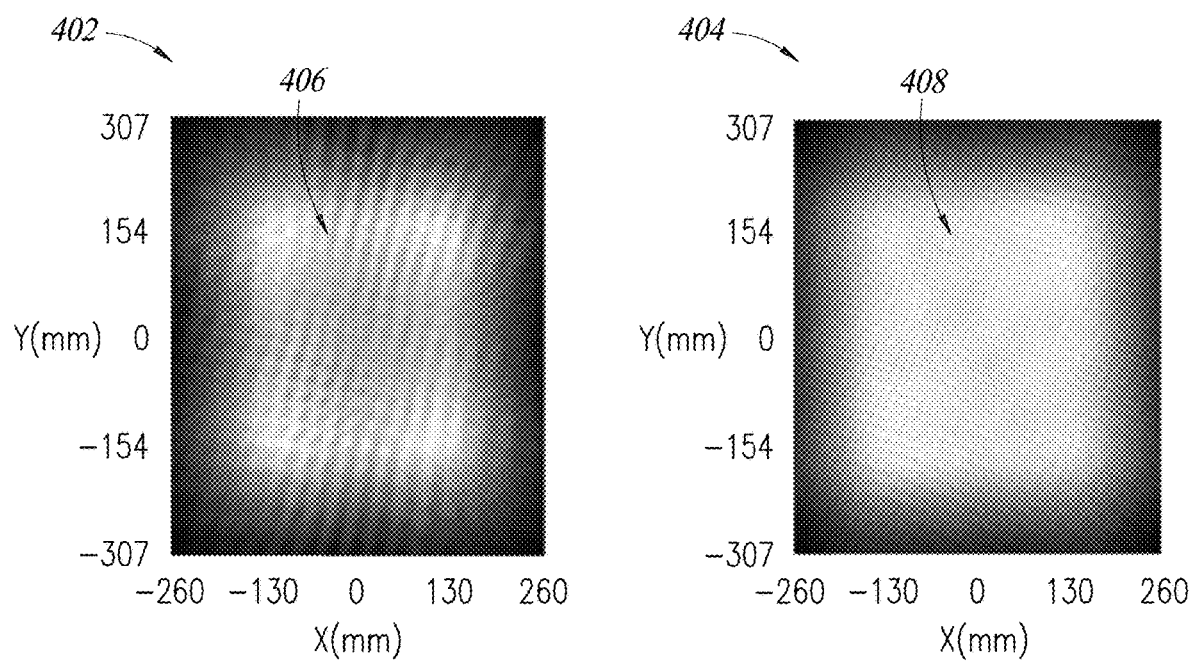
FIG. 4 illustrates two outputs of a conventional high-resolution illumination system.

FIG. 4 illustrates two outputs 402 and 404 of a conventional high-resolution illumination system. The first output 402 shows a low frequency beating pattern 406 formed of striations and the second output 404 shows a high frequency beating pattern 408 formed of striations. As illustrated, not only does the high-resolution system resolve the structured low frequency beating pattern 406, but the high-resolution illumination system also resolves the structured high frequency beating pattern 408. Although not shown, a conventional low-resolution illumination system may not be able to resolve the structured high frequency beating pattern 408.

The beating patterns 406, 408 (i.e., structured non-uniformity of illumination) are created when beating occurs between speckle patterns associated with (i.e. created by) independent laser emitters. That is, the angular coincidence of the speckle patterns results in the beating of the speckle patterns, thereby structuring the noise of the system into typically higher frequency patterns, as illustrated. The frequency and strength of the beating pattern may depend upon one or more of emitter array period (e.g., the periodic distribution (in one or two orthogonal directions) of emitters in a 2D array), the optical period of the diffuser, and the wavelength of the light.

Referring back to FIG. 2, the diffuse illumination system 102 includes the VCSEL emitter array 110 having a substrate 202, VCSEL emitters 204, and the diffusing element 112. Each VCSEL emitter 204 includes an emission surface 205 though which light generated by the emitter 204 is propagated. The diffusing element 112 includes a transparent substrate 206 and an array 208 of nanostructures 210. The transparent substrate 206 has an upper surface 211 and a lower surface 212. In one embodiment, and as illustrated, the lower surface 212 (i.e., portions of the lower surface 212) of the transparent substrate 206 is positioned on the emission surface 205 of each of the plurality of emitters 204. However, as mentioned above in conjunction with FIG. 1, a transparent spacing element (not shown) may be positioned on the emission surface 205 of each of the plurality of emitters 204 and the lower surface 212 of the transparent substrate 206 may be positioned on the transparent spacing element (i.e., the transparent spacing element is positioned between the diffusing element 112 and the VCSEL emitter array 110).

The nanostructure array 208 is positioned on the upper surface 211 of the transparent substrate 206. In one embodiment, each nanostructure 210 extends away from the upper surface 211 in a direction that is perpendicular to the upper surface 211. The nanostructures 210 will be discussed in more detail further below. In an alternate embodiment, each nanostructure 210 may extend perpendicularly away from the lower surface 212 toward the VCSEL emitter array 110.

The emitter array 110 include rows 214 of emitters 204 and columns 216 of emitters 204. In one embodiment, and as illustrated, the rows 214 are parallel to one another, the columns 216 are parallel to one another, and the rows and columns are perpendicular to one another. However, the scope of the present disclosure covers 2D arrays formed of rows and columns of emitters having any angle with respect to one another.

In one embodiment, adjacent emitters 204 in a row 214 of emitters 204 have a first pitch and adjacent emitters 204 in a column 216 of emitters 204 have a second pitch. The scope of the present disclosure covers the first pitch equal to the second pitch, and the first pitch not equal to the second pitch. For ease of description, the rows 214 may be considered to be in an X direction 222 and the columns 216 may be considered to be in a Y direction 224 in an X-Y-Z orthogonal coordinate system 226, however, the scope of the present disclosure covers arrays 110 having layouts of the rows 214 and columns 216 in any two orthogonal directions or any two non-orthogonal directions. Thus, although the present disclosure for ease of description may present some embodiments having X and Y pitch, or X and Y rows/columns, these embodiments include pitches and rows/columns being formed in any two directions confined to a plane.

In one embodiment of the present disclosure, the VCSEL emitters 204 emit light of approximately the same wavelength, within tolerances resulting from manufacturing inconsistencies and/or material imperfections, such as material impurities. In an embodiment, the light emitted by the VCSEL emitters 204 have a wavelength of about 930 to 950 nm. In other embodiments, both the x and y pitches 218 and 220, respectively, of the emitter array 110 are approximately equal to or less than the wavelength of the light emitted by the emitters 204.

In one embodiment, the transparent substrate 206 may be formed from Glass, Fused silica or another dielectric material. In another embodiment, the nanostructures 210 may be formed from amorphous silicon, polycrystalline silicon or other materials presenting significant refractive index contrast to the transparent encapsulant 230. As illustrated, the nanostructures 210 are separated by gaps 228. Although the gaps 228 are illustrated as having different dimensions (i.e., different volumes), the gaps 228 between the nanostructures 210 may have the same uniform dimension.

In one embodiment, air fills the gaps 228 between the nanostructures 210. In another embodiment, the diffusing element 112 includes an optional transparent encapsulant 230. The transparent encapsulant 230 covers the array of nanostructures 210, thereby filling the gaps 228 between the nanostructures 210 with the encapsulant 230. In an embodiment, the transparent encapsulant is formed from silicon dioxide, however, the scope of the present disclosure covers transparent encapsulants formed of polymers, dielectrics or other materials with refractive index sufficiently low to present appropriate refractive index contrast with the high index nanostructures.

In an embodiment, the material forming the nanostructures 210 is chosen such that the nanostructures 210 have a higher index of refraction than the index of refraction of the material filling the gaps 228 between the nanostructures 210 (i.e., either ambient air or material forming the encapsulant) and the index of refraction of the transparent substrate 206. In one embodiment, the index of refraction of the nanostructures 210 is preferably at least 1.5 times greater than the index of refraction of the material filling the gaps 228 between the nanostructures 210. This has the advantageous effect of increasing the polarizing efficiency of the nanostructures 210. The polarizing effect of the nanostructures will be discussed further below in more detail.

In one embodiment of the present disclosure, the nanostructure array 208 includes rows 232 of nanostructures 210 and columns 234 of nanostructures 210. In one embodiment, and as illustrated, the rows 232 are parallel to one another, the columns 234 are parallel to one another, and the rows and columns are perpendicular to one another. However, the scope of the present disclosure covers 2D arrays of nanostructures 208 formed of rows and columns of nanostructures having any angle with respect to one another.

In one embodiment, adjacent nanostructures 210 in a row 232 of nanostructures 210 have a third pitch and adjacent nanostructures 210 in a column 234 of nanostructures 210 have a fourth pitch. The scope of the present disclosure covers the third pitch 236 equal to the fourth pitch 238 and the third pitch 236 different than the fourth pitch 238. In addition, third pitch and the fourth pitch may each be fixed or variable. In one embodiment, the third and fourth pitches 236, 238 are less than or about equal to the wavelength of light emitted by the VCSEL emitters 204.

In another embodiment, the first, second, third and fourth pitches 218, 220, 236 and 238, respectively, are different from one another. In yet another embodiment, the first pitch 218 is greater than the third pitch 236 and the fourth pitch 238, and the second pitch 220 is greater than the third pitch 236 and the fourth pitch 238. In another embodiment, the first pitch 218 is equal to the second pitch 220, the third pitch 236 is equal to the fourth pitch 238 and the first and third pitches 218, 236 are different.

In an embodiment of the present disclosure, a dimension and/or a shape of each nanostructure 210 is configured to retard a phase of a first polarization state and retard a phase of a second polarization state of light incident on the nanostructure 210, emitted from one or more of the emitters 204, for reducing illumination inhomogeneities. As light passes through the transparent substrate 206 and impinges upon the nanostructures 210, the electric and magnetic fields of the incident light generates induction fields in the nanostructures 210, which then interact with the fields of the impinging light for polarizing the light, which is particularly efficient when the index of refraction of the nanostructures 210 is greater than the index of refraction of both the transparent substrate 206 and/or the material filling the gaps 228 between the nanostructures 210 (i.e., ambient air or the material that composes the encapsulant 230).

In an embodiment, the light incident on each nanostructure 210 is emitted by at least one emitter 204. For example, in one embodiment, a layout of the nanostructure array 208 is the same as a layout of the emitter array 110. That is, positioned directly below each nanostructure 210 is a single emitter 204, or in other words, thus the x and y pitches of the nanostructure array 208 is equal to the x and y pitches of the emitter array 110. In this embodiment, light incident on any given nanostructure 210 is emitted by only the emitter 204 positioned directly beneath it. However, depending upon whether the system 102 includes an optional transparent spacing element and/or upon the X-Y dimensions (i.e., cross-sectional dimensions) of any given nanostructure 210 in comparison with the X-Y dimensions of the emitter 204 positioned directly underneath, the light incident on any given nanostructure 210 may be emitted by two or more emitters 204.

In other embodiments in which at least one of the first pitch 218, the second pitch 220, the third pitch 236 and the fourth pitch 238 is different from the other pitches, the light incident on some of the nanostructures 210 may be emitted by two or more emitters 204, and the light incident on the other nanostructures 210 may be emitted by only one emitter 204.

In one embodiment, the first polarization state is orthogonal to the second polarization state. For example, the first polarization state may be an S-polarization state and the second polarization state may be a P-polarization state, however the scope of the present disclosure covers mixed mode light (i.e., light including many polarization states, such as linearly polarized, circularly polarized (left and/or right), elliptical polarized (left and right)) and unpolarized light emitted by the emitters 204. P-polarization refers to light polarized parallel to the plane of incidence (i.e., the plane in which beams of incident light and beams of light scattered by the nanostructures 210 lie), and S-polarization refers to light polarized perpendicular to the plane of incidence.

In one embodiment, a shape of each nanostructure 210 is defined to be a shape of a cross section of the nanostructure 210, where the cross section is defined to be in a plane parallel to a surface of the transparent substrate 206, such the lower surface 212 of the transparent substrate or the upper surface 211 of the transparent substrate 206 (i.e., the X-Y plane of the coordinate system 226). The dimension of a nanostructure 210 may be defined by one or more dimensions of the cross section of the nanostructure 210, such as one or more of a radius, a circumference, an area, lengths of sides, and lengths of major and minor axes for elliptical cross sections. In another embodiment, the dimensions may include parameters that define three-dimensional aspects of the nanostructure 210, such as a height of the nanostructure measured in a direction perpendicular from the upper surface 210 of the transparent substrate 206 (i.e., measured in a Z-direction of the coordinate system 226.

In one embodiment, the nanostructures 210 are pillars. In some embodiments, each pillar 210 has a cross section of an ellipse, circle, square, or rectangle. In other embodiments, heights of the pillars 210 may be greater than at least one dimension of the cross section of the pillar, or heights may be less than each of the dimensions of the cross section of the pillar. That is, a height of a pillar may be smaller than any transverse (i.e., X-Y) dimension of the pillar. As illustrated in the FIG. 2 embodiment, the pillars have elliptical cross sections 240.

In one embodiment, when the cross-sectional shape of a pillar is a circle or a square, then the phase of the first polarization state and the phase of the second polarization state are retarded by a same magnitude. The magnitude by which the phase is retarded may be based on a dimension of the cross-sectional shape, such as diameter of the circle and a length of a side of the square. When the cross-sectional shape of a pillar is an ellipse (as illustrated by FIG. 2) or a rectangle, then the phase of the first polarization state and the phase of the second polarization state are retarded by different magnitudes. The magnitudes by which the phases are retarded are based on lengths of major and minor axes of those pillars having elliptical cross sections and the lengths of the sides of those pillars having rectangular cross sections.

In one embodiment, the array 208 of pillars 210 includes pillars of different shapes and/or dimensions that are selected at random. For example, the output of a random number generator may be used to randomly select the shapes/sizes of the pillars 210. The pillars 210 of the array 208, being randomly selected, but constrained to include at least some pillars with elliptical cross sections, rectangular cross sections, or a mixture of elliptical and rectangular cross sections, and selected to generate some S and P-polarized light from the incident light, will act to reduce the effect of the beating of speckle patterns in the illumination output.

That is, the pillars 210 will act as polarizing scatterers. In the exemplary embodiment of FIG. 2, the elliptical pillars 210 have elliptical cross sections 240 defined by a major axis in the x direction 222 and a minor axis in the y direction 224. Thus, these pillars 210 will scatter the incident light to generate P-polarized light. Other elliptical pillars (not shown) having elliptical cross sections defined by major axes in the y direction 224 and minor axes in the x direction 222 will scatter the incident light to generate S-polarized light.

Figure 5:
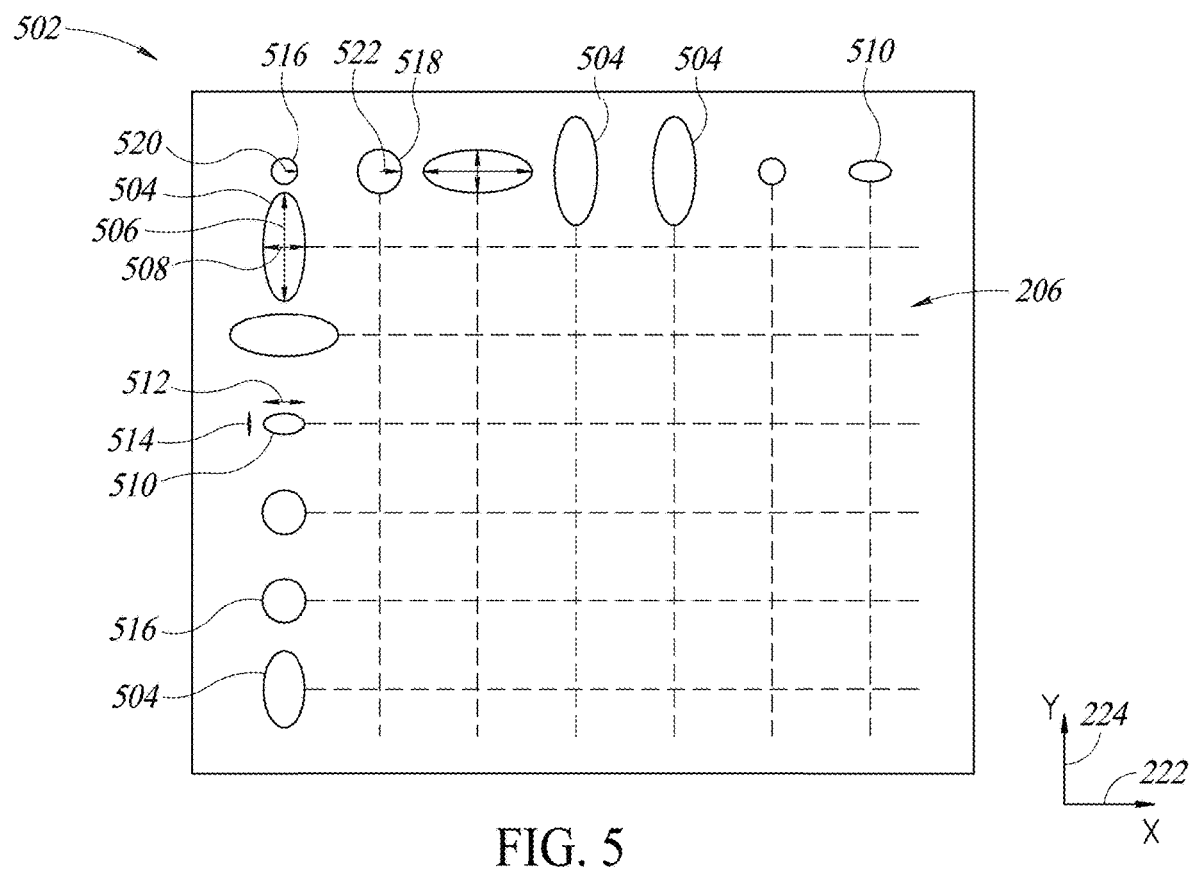
FIG. 5 is a top-down view of an array of pillars positioned on the transparent substrate of FIG. 2, according to an embodiment of the present disclosure.

FIG. 5 is a top-down view of pillar array 502 positioned on the transparent substrate 206, according to an embodiment of the present disclosure. As illustrated, the pillar array 502 includes pillars 504 that are large elliptical pillars having elliptical cross sections defined by a major axis 506 in the Y-direction 224 and a minor axis 508 in the X-direction 222 (thereby generating S-polarized light), pillars 510 that are smaller elliptical pillars having elliptical cross sections defined by a major axis 512 in the X-direction 222 and a minor axis 514 in the Y-direction 224 (thereby generating P-polarized light), and pillars 516 and 518 that are small and larger cylindrical pillars, respectively, having circular cross sections defined by a first radius 520 and a second radius 522 (thereby retarding the phases of the P and S-polarization states equally).

Figure 6:
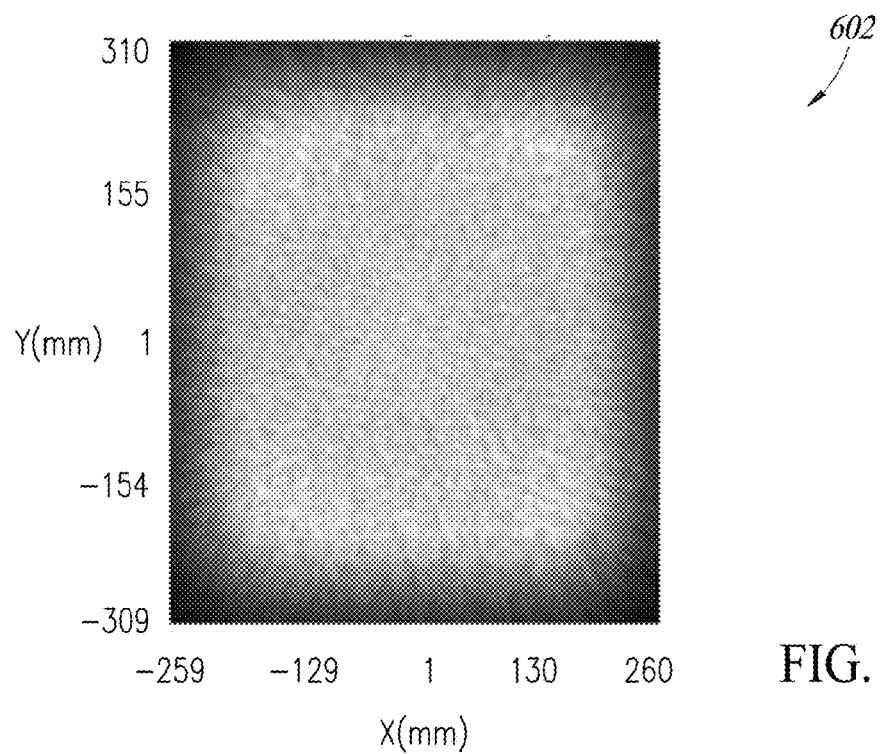
FIG. 6 illustrates an output of the illumination system of FIG. 2, according to an embodiment of the present disclosure.

FIG. 6 illustrates an output 602 of the illumination system 102, according to an embodiment of the present disclosure. When compared to the outputs 402 and 404 of a conventional illumination system with a diffusing element, the output 602 of the illumination system 102 of the present disclosure shows a significant improvement in the uniformity of the diffuse illumination, including significant reductions in the structured beating patterns, as well as apparent reductions in the speckle patterns, both of which are observed in FIG. 4.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A diffuse illumination system, comprising:
    a vertical cavity surface emitting laser (VCSEL) substrate;
    an array of VCSEL emitters on the VCSEL substrate, each of the VCSEL emitters being configured to emit light; and
    a diffusing element including a transparent substrate and an array of nanostructures positioned on the transparent substrate, the transparent substrate being on the VCSEL substrate and emission surfaces of the VCSEL emitters,
    wherein the transparent substrate has a first index of refraction, and the array of nanostructures have a second index of refraction greater than the first index of refraction,
    wherein each nanostructure is configured to receive light from one or more of the VCSEL emitters and retard a phase of at least one of a first polarization state and a second polarization state of the received light,
    wherein the first polarization state is orthogonal to the second polarization state.

2. The system of claim 1, wherein the diffusing element includes a transparent encapsulant, the transparent encapsulant covers the array of nanostructures, and the transparent encapsulant has an index of refraction that is lower than an index of refraction of the array of VCSEL emitters.

3. A diffuse illumination system, comprising:
    a vertical cavity surface emitting laser (VCSEL) substrate;
    an array of VCSEL emitters on the VCSEL substrate, each of the VCSEL emitters having an emission surface though which light is emitted; and
    a diffusing element including a transparent substrate and an array of nanostructures, the transparent substrate being on the VCSEL substrate and emission surfaces of the VCSEL emitters, the transparent substrate having a first surface facing the VCSEL substrate and a second surface opposite the first surface, the transparent substrate overlying each of the VCSEL emitters, the array of nanostructures positioned on the second surface of the transparent substrate,
    wherein the transparent substrate has a first index of refraction, and the array of nanostructures have a second index of refraction greater than the first index of refraction,
    wherein a dimension and a shape of each nanostructure is configured to retard a phase of a first polarization state and retard a phase of a second polarization state of light incident on each nanostructure,
    wherein the first polarization state is orthogonal to the second polarization state, and
    wherein the light incident on each nanostructure is emitted by at least one emitter of the array of VCSEL emitters.

4. The system of claim 3, wherein the transparent substrate is formed from glass, fused silica, or other dielectric material and the nanostructures are formed from amorphous silicon, polycrystalline silicon or other materials presenting significant refractive index contrast to the transparent substrate.

5. The system of claim 3, wherein the diffusing element further comprises a transparent encapsulant, wherein the transparent encapsulant covers the array of nanostructures, and wherein the transparent encapsulant has an index of refraction that is lower than an index of refraction of the array of VCSEL emitters.

6. The system of claim 3 wherein the dimension and the shape of each nanostructure is configured to retard the phase of the first polarization state and retard the phase of the second polarization state of light incident on each nanostructure by the same magnitude.

7. The system of claim 3 wherein the dimension and the shape of each nanostructure is configured to retard the phase of the first polarization state and retard the phase of the second polarization state of light incident on each nanostructure by different magnitudes.

8. The system of claim 3, wherein the array of VCSEL emitters comprises rows of emitters and columns of emitters, wherein adjacent emitters in each row of emitters are separated by a first pitch, wherein adjacent emitters in each column of emitters are separated by a second pitch, wherein the array of nanostructures comprises rows of nanostructures and columns of nanostructures, wherein adjacent nanostructures in each row of nanostructures are separated by a third pitch, and wherein adjacent nanostructures in each column of nanostructures are separated by a fourth pitch, wherein the light emitted by the emitters of the array of VCSEL emitters has a wavelength, and wherein the third and fourth pitches are less than or about equal to the wavelength.

9. The system of claim 8, wherein the first surface of the transparent substrate is spaced apart from the emission surface of each of the VCSEL emitters by an air gap.

10. The system of claim 8, wherein the nanostructures are pillars.

11. The system of claim 8, wherein the first pitch, the second pitch, the third pitch and the fourth pitch are different from one another.

12. The system of claim 8, wherein the first pitch is greater than the third pitch and the fourth pitch, and the second pitch is greater than the third pitch and the fourth pitch.

13. The system of claim 12, wherein the first pitch is equal to the second pitch and the third pitch is equal to the fourth pitch.

14. The system of claim 3, wherein illumination inhomogeneities include structured noise resulting from a beating of speckle patterns, wherein a speckle pattern results from an interference of the light emitted from an emitter passing through the diffusing element.

15. The system of claim 14, wherein the first polarization state is an S-polarization state and the second polarization state is a P-polarization state.

16. The system of claim 15, wherein the nanostructures are pillars separated from one another by gaps, wherein the gaps between the pillars include either air or a transparent encapsulant material, wherein the second index of refraction is greater than an index of refraction of air and an index of refraction of the transparent encapsulant material, and wherein the shape is a cross-sectional shape defined in a plane parallel to the second surface of the transparent substrate, and wherein the dimension is a dimension of the cross-sectional shape.

17. The system of claim 16, wherein the cross-sectional shape of each pillar is one of an ellipse, a circle, a square and a rectangle.

18. The system of claim 17, wherein when the cross-sectional shape of a pillar is one of the circle or the square, then the phase of the first polarization state and the phase of the second polarization state are retarded by a same magnitude, wherein a value of the same magnitude is based on a diameter of the circle and a length of a side of the square.

19. The system of claim 17, wherein when the cross-sectional shape of a pillar is one of the ellipse or the rectangle, then the phase of the first polarization state and the phase of the second polarization state are retarded by different magnitudes, wherein values of the different magnitudes are based on values of major and minor axes of the ellipse and lengths of two sides of the rectangle.

20. The system of claim 17, wherein light emitted by the VCSEL emitters has a wavelength, wherein the shape and the dimension of each pillar is selected at random, and wherein the dimension of each pillar is less than or about equal to the wavelength.

21. A system, comprising:
a diffuse illumination system, including
a vertical cavity surface emitting laser (VCSEL) substrate;
an array of VCSEL emitters on the VCSEL substrate, each of the VCSEL emitters having an emission surface though which light is emitted, and
a diffusing element including a transparent substrate and an array of nanostructures, the transparent substrate being on the VCSEL substrate and emission surfaces of the VCSEL emitters, the transparent substrate having an upper surface and a lower surface facing the VCSEL substrate, the lower surface of the transparent substrate positioned above the emission surface of each of the VCSEL emitters, the array of nanostructures positioned on the upper surface of the transparent substrate,
wherein the transparent substrate has a first index of refraction, and the array of nanostructures have a second index of refraction greater than the first index of refraction,
wherein a dimension and a shape of each nanostructure is configured to retard a phase of a first polarization state and retard a phase of a second polarization state of light incident on each nanostructure,
wherein the first polarization state is orthogonal to the second polarization state, and
wherein the light incident on each nanostructure is emitted by at least one emitter of the array of VCSEL emitters;
a processor;
a lens system; and
a detector, wherein:
the processor is configured to trigger the light to be emitted by the VCSEL emitters,
the lens system is configured to direct the light to a target, and
the detector is configured to receive light reflected from the target via the lens system.

22. The system of claim 21, wherein the system is a time-of-flight camera, and wherein the processor is configured to determine time-of-flight to the target based upon the emitted and the received light.

23. The system of claim 21, wherein the system is a machine vision camera.

* * * * *

UNITED STATES PATENT AND TRADEMARK OFFICE
CERTIFICATE OF CORRECTION

| | | |
|---|---|---|
| PATENT NO. | : 11,762,212 B2 | Page 1 of 1 |
| APPLICATION NO. | : 16/817435 | |
| DATED | : September 19, 2023 | |
| INVENTOR(S) | : James Peter Drummond Downing | |

It is certified that error appears in the above-identified patent and that said Letters Patent is hereby corrected as shown below:

In the Claims

Column 10, Claim 3, Line 6:
"though which light" should read: --through which light--.

Column 12, Claim 21, Line 10:
"surface though which" should read: --surface through which--.

Signed and Sealed this
Thirty-first Day of October, 2023

Katherine Kelly Vidal
*Director of the United States Patent and Trademark Office*